ELECTRICAL CIRCUIT BOARD RETAINER

Filed Dec. 28, 1967

INVENTORS
ERIC WINSTON
MAQBOOL QURASHI
BY
Hopgood & Calimafde
ATTORNEYS 3,479,633

ELECTRICAL CIRCUIT BOARD RETAINER

Eric Winston, Melrose Park, Pa., and Maqbool Qurashi, Pennsauken, N.J., assignors to Jerrold Electronics Corporation, Hatboro, Pa., a corporation of Delaware Filed Dec. 28, 1967, Ser. No. 694,137
Int. Cl. H01r *3/04*; H05k *1/18*
U.S. Cl. 339—14 7 Claims

ABSTRACT OF THE DISCLOSURE

A modular electronic circuit board retaining framework to hold a circuit board in proper contact with connecting circuitry. The framework is comprised basically of two overlying frames, between which a modular circuit board is clamped. The components of the frames correspond generally to the peripheral dimensions of the circuit board but may also include supporting cross members. The frames are intended for use with circuit boards with ground contacts disposed about the periphery thereof and under the supporting cross members of the frames. A multitude of slightly raised projections disposed upon the frames in the vicinity of the screws holding them together provide multiple contact points for the circuitry.

BACKGROUND

The invention concerns the structure of enclosures which retain and provide electrical contacts for electrical circuit board components, and deals specifically with effecting a good ground connection between the enclosure and such components.

In the prior art, many circuit boards were held to their retaining members at a limited number of discrete points; for example, by washer and screw combinations, or spring loaded fingers. These points also served as electrical contact points between the circuitry on the board and its retainer.

When circuit boards are connected to the retainer at only a few discrete points, the concentration of pressure at these points tends to loosen the connection over long periods of time, especially when the installation is subjected to varying temperature conditions. Cold flow of the material of the board at these high pressure points is a principal cause of this loss of contact. This condition results in eventual degradation of ground contact with consequent poor circuit performance.

It is, therefore, an object of this invention to improve circuit performance by providing more reliable and more durable electrical contact between the board and its holder.

SUMMARY OF THE INVENTION

Briefly, the invention is of a circuit board holder made up of two substantially identical frames that clamp together framing the circuit board in between. The frames have a multitude of contact points projecting therefrom concentrated in the areas of clamping pressure, which deformably engage the circuit on the board when the holder is assembled. Elements of the circuitry upon the board are disposed along its edges so as to underlie the contact points. The projections dig into the circuitry as the frames are drawn together establishing a multitude of discrete selected electrical contact points.

The invention overcomes the disadvantages of the prior art, eliminating the concentration of retaining pressure at relatively few points on the board, and the cold flow associated therewith.

In addition to distributing the retaining pressure over a larger area, the projections provide a known number of discrete contact points placed at the most advantageous positions around the frames, and thus avoid the variation in circuit characteristics which accompany random ground. By distributing the retaining pressure to a large number of selected contact points, which individually deform the circuit elements on the board, electrical contact between the circuitry and the retainer is greatly enhanced.

Other objectives, advantages, and various further features of novelty and invention will be pointed out or will occur to those skilled in the art from a reading of the following specification in conjunction with the accompanying drawings.

DESCRIPTION OF PREFERRED EMBODIMENT

Figures 1, 2:
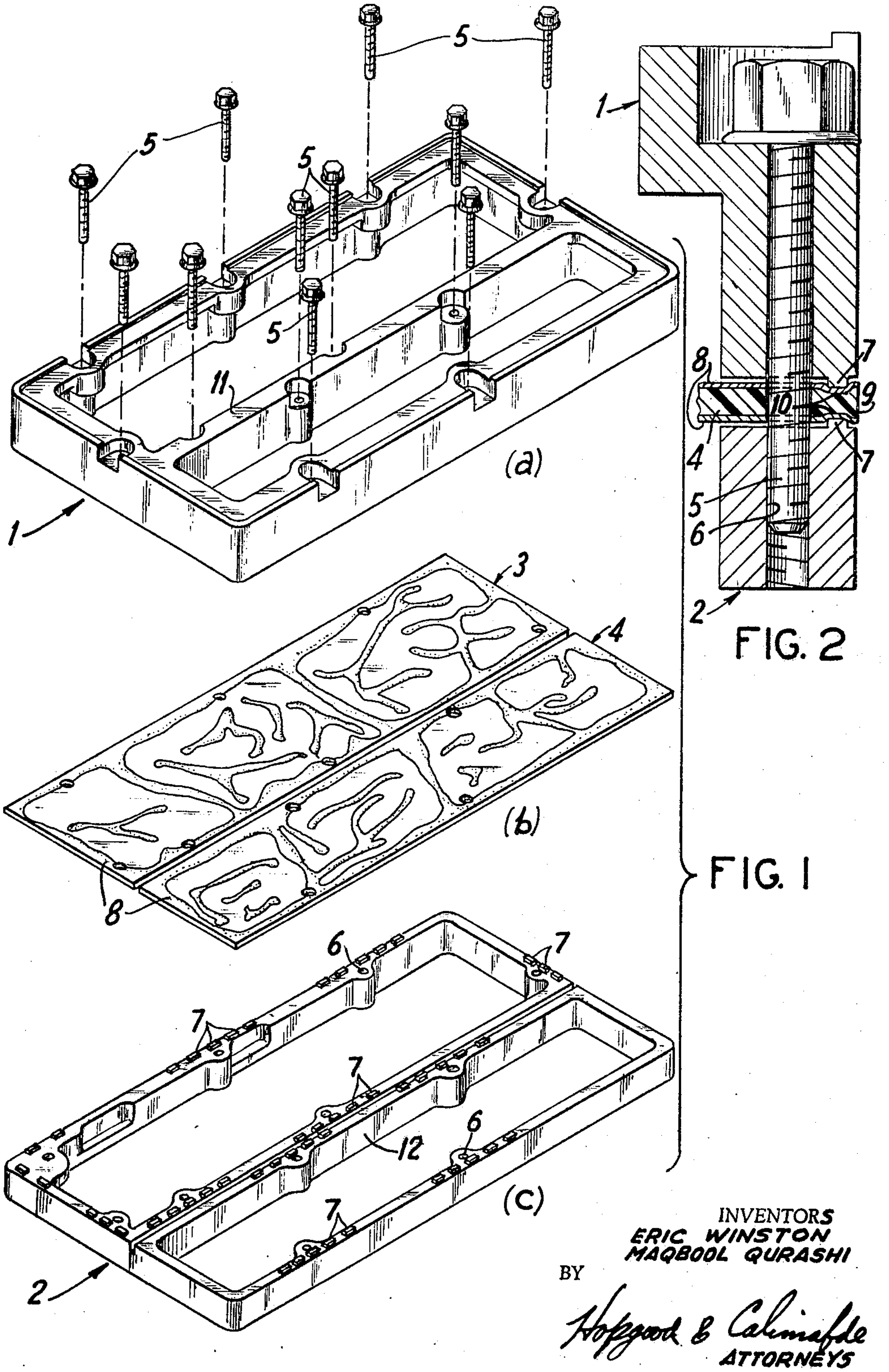
FIGURE 1 is an exploded perspective view of the holder of the invention.
FIGURE 2 is an expanded partial cross-sectional end view of the components of FIGURE 1 after assembly.

FIGURE 1 illustrates an embodiment of the invention wherein the frames are configured to retain two circuit boards. The shape of the frames is dictated principally by the shape of the circuit boards, as the frame elements abut the peripheral edges of the boards. The function of the frames is to securely retain the circuit board in a desired position.

This function is most efficiently accomplished by the use of edge frames, which provide a maximum of contact with the circuit boards while not utilizing valuable circuit space in the center of the boards.

Referring to FIGURE 1, frame elements 1 and 2 are seen in position for assembly with circuit boards 3 and 4. When the assembly is brought together, frames 1 and 2 will diametrically oppose each other from opposite sides of the circuit boards and will lie principally along the edges of the boards. The frames are held together by screws 5 which pass through frame 1 and circuit boards 3 and 4 and thread into receptacle 6 in frame 2. By passing through circuit boards 3 and 4, screws 5 provide an additional means for positive retention of the boards.

FIGURE 1*c* also illustrates the contact face of frame 2. Contact points 7 protrude in the direction of the circuit boards. Each point constitutes a region of greater pressure when the retainer is assembled. The contact points 7 are preferably rectangular, having a rounded facial area to prevent puncture of the circuit elements 8 when the retainer is assembled. The height of the contact points 7 is kept to a minimum to save space, but must be sufficient to provide clearance between the remainder of the frames and the circuit elements 8 after assembly. Contact points 7 are grouped in the vicinity and on both sides of screws 5 to take advantage of the pressure exerted on the boards at these points. The bottom of frame 1 (not shown) has a similar disposition of protruding pressure points when circuit elements are disposed on both sides of the circuit board.

Circuit boards 3 and 4 used in conjunction with frames 1 and 2 are of a standard variety, but have circuit elements 8 disposed about their periphery so as to underlie the frames. Contact elements 8 are grounded to frames 1 and 2 by electrical contact with the pressure points 7.

Upon assembly, as screws 5 are tightened drawing frames 1 and 2 together onto circuit boards 3 and 4, the protruding pressure points 7 dig into and deform the circuit elements 8. The remaining portion of the frames do not come in physical contact with the circuit boards. The result of this configuration is a multiple of electrical contacts established in the area of each assembly screw. The number of contact points and their location can be varied as desired, permitting control over the grounding characteristics of the retainer.

FIGURE 2 is a partial cross-sectional view of the completed assembly. Frames 1 and 2 appear in their opposing positions on opposite sides of the circuit board 3. The outside edges of frames 1 and 2 being substantially coextensive with the outside edge 9 of the circuit board. Assembly screw 5 has been tightened to draw the frames together. As circuit board 3 is illustrated with circuit elements 8 on both sides, contact points 7 are incorporated in the contact face of both frames. The depressions 10 made in circuit elements 8 on board 3 by contact points 7 are clearly evident.

As the embodiment of the invention illustrated in FIG. 1 incorporates two circuit boards, cross arms 11 and 12 are utilized to retain the inside edges of the boards. Cross arms 11 and 12 contain contact points 7 precisely like those on frames 1 and 2; however, since the edges of two circuit boards are engaged by the same arms, the cross arms must have contact points on each side of their contact faces. The cross arms are held together by retaining screws 5 which pass through arm 11, circuit boards 3 and 4, and into arm 12.

It is occasionally desirable to incorporate cross arms where only a single circuit board is utilized. In that case the cross arms are very similar to the outside frames, having a series of contact points disposed adjacent to the bolts drawing the support arms together. When that configuration is used, circuit elements must be disposed not only on the edges of the board, but also under the cross arms to provide the proper ground.

While the principles of the invention have been described in connection with the above specific apparatus, it is to be clearly understood that this description is made only by way of example and not as a limitation to the scope of the invention.

We claim:

1. An electrical circuit board retainer comprised of:
   - a first frame of electrically conducting material, the peripheral elements of which abut the top edges of the circuit board to be retained,
   - a second frame of substantially the same dimensions as said first frame, the peripheral elements of which abut the bottom edges of the circuit board to be retained in substantially diametric opposition to said first frame,
   - a multiplicity of raised contact projections upon at least one of said frames extending in the direction of the circuit board and into electrical contact with circuit elements thereon,
   - and means to urge said first and second frames together with the circuit board therebetween, whereby said board is physically held by and electrically connected to said frames at a multiplicity of discrete contact points.

2. The retainer of claim 1, wherein said raised contact projections are disposed about the periphery of said frame for contact with the electrical circuitry upon a circuit board.

3. The retainer of claim 2, wherein said contact projections are comprised of:
   - a contact face, the area of which is more than ten times the square of the height of the projections, and are disposed in the vicinity of and on opposite sides of said screws.

4. The retainer of claim 3, wherein said means to urge said first and second frames together is comprised of:
   - a plurality of bolts which pass through said frames and said circuit board,
   - and wherein a plurality of said raised contact projections is concentrated in the area of each of said bolts.

5. The retainer of claim 4 in combination with an electrical circuit board including:
   - electrical contact means disposed upon at least one side thereof in the areas underlying the contact projections of at least one of said frames to ground the circuitry on said board to said frame.

6. The combination of claim 5, wherein said first and second frames are further comprised of:
   - complementary cross members which extend between the peripheral elements thereof mutually over and under preselected areas of said circuit board, said cross members having a plurality of said raised contact projections,
   - and contact elements on one side of said circuit board coextensive with said cross members and underlying a plurality of said contact projections.

7. The combination of claim 6, wherein
   - a plurality of circuit boards is disposed within the areas defined by said first and second frames and said cross members, each of which has a plurality of edges engaged by the retainer.

References Cited

UNITED STATES PATENTS

| | | | |
|---|---|---|---|
| 2,786,969 | 3/1957 | Blitz. | |
| 3,149,893 | 9/1964 | Dupre | 339—14 |
| 3,158,926 | 12/1964 | Nieter. | |
| 3,212,047 | 10/1965 | McDonough. | |

MARVIN A. CHAMPION, Primary Examiner

PATRICK A. CLIFFORD, Assistant Examiner

U.S. Cl. X.R.

339—17